United States Patent
Cabral, Jr. et al.

(10) Patent No.: US 6,413,859 B1
(45) Date of Patent: *Jul. 2, 2002

(54) METHOD AND STRUCTURE FOR RETARDING HIGH TEMPERATURE AGGLOMERATION OF SILICIDES USING ALLOYS

(75) Inventors: Cyril Cabral, Jr., Ossining; Roy Arthur Carruthers, Stormville; James McKell Edwin Harper, Yorktown Heights; Paul Michael Kozlowski, Hopewell Junction; Christian Lavoie, Ossining; Joseph Scott Newbury, Tarrytown; Ronnen Andrew Roy, Ossining, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/519,898

(22) Filed: Mar. 6, 2000

(51) Int. Cl.⁷ .......................................... H01L 21/4763
(52) U.S. Cl. ...................... 438/649; 438/655; 438/656; 438/682; 438/683
(58) Field of Search ................................ 438/642, 643, 438/648, 649, 655, 656, 663, 664, 682, 683

(56) References Cited

U.S. PATENT DOCUMENTS

| | | | |
|---|---|---|---|
| 5,510,295 A | 4/1996 | Cabral, Jr. et al. | 438/656 |
| 5,608,226 A | 3/1997 | Yamada et al. | 250/491.1 |
| 5,624,869 A | 4/1997 | Agnello et al. | 438/602 |
| 5,824,600 A * | 10/1998 | Byun et al. | 438/682 |
| 5,828,131 A | 10/1998 | Cabral, Jr. et al. | 257/757 |
| 6,096,599 A * | 8/2000 | Kepler et al. | 438/249 |
| 6,187,679 B1 * | 2/2001 | Cabral, Jr. et al. | 438/682 |
| 6,204,177 B1 * | 3/2001 | Besser et al. | 438/683 |

OTHER PUBLICATIONS

Clevenger et al., Formation of a crystalline metal–rich silicide in thin film titanium/silicon reactions, *Thin Solid Films*, 289 (1996) 220.*

Cabral et al., Low temperature formation of C54–TiSi$_2$ using titanium alloys, *Appl. Phys. Lett.*, 71 (1997) 3531.*

Bae et al., Formulation of ultra–shallow junctions using epitaxial CoSi$_2$ thin film as diffusion sources, *Thin Solid Films*, 302 (1997) 260.*

M. Lawrence, et al., "Growth of Epitaxial CoSi$_2$ on (100) Si," Appl. Phys. Letts., vol. 58, No. 12, pp. 1308–1310 (1991).

C. Cabral, et al., "In–Situ X–Ray Diffractin and Resistivity Analysis of CoSi2 Phase Formation With and Without in Ti Interlayer at Rapid Thermal Annealing Rates," Mat. Res. Soc. Symp. Proc., vol. 375, pp. 253–258 (1995).

* cited by examiner

Primary Examiner—Michael S. Lebentritt
Assistant Examiner—Christian D. Wilson
(74) Attorney, Agent, or Firm—Scully, Scott, Murphy & Presser; Robert M. Trepp

(57) ABSTRACT

Complementary metal oxide semiconductor (CMOS) devices having metal silicide contacts that withstand the high temperature anneals used in activating the source/drain regions of the devices are provided by adding at least one alloying element to an initial metal layer used in forming the silicide.

23 Claims, 4 Drawing Sheets

METHOD AND STRUCTURE FOR RETARDING HIGH TEMPERATURE AGGLOMERATION OF SILICIDES USING ALLOYS

FIELD OF THE INVENTION

The present invention relates to complementary metal oxide semiconductor (CMOS) devices, and more particular to a method of fabricating CMOS devices having at least one metal silicide contact in which high temperature agglomeration of the same, typically caused during source/drain activation, is substantially eliminated. The present invention also provides CMOS structures having non-agglomerated metal silicide contacts prepared by the inventive process.

BACKGROUND OF THE INVENTION

In current CMOS technology, metal silicide contacts are formed by a self-aligned process after the devices of the structure have been completed. The temperature necessary for silicide formation is high enough to significantly affect the dopant distribution in devices with shallow p-n junctions. The silicide anneals are also of sufficient duration to cause potential deactivation of dopants whose concentration is higher than the solubility limit at the siliciding annealing temperatures, leading to higher source/drain resistance.

In order to keep the dopant profile as tight as possible and avoid possible dopant deactivation, it would be advantageous to form the silicide before the dopants are implanted into the substrate. The disadvantage of the order of the processing steps is that if the silicide is formed before dopant implantation, the silicide needs to withstand the high temperature anneal (temperature of about 900° C. or above) necessary for activating the implanted dopants. At these high temperatures, the electrical characteristics of the silicides in logic devices are severely degraded by the agglomeration of the silicide film.

One alternative to the above problem is to increase the thickness of the silicide film. If the dopant implantation occurs after silicide formation, the larger consumption of the silicon does not affect the junction depth as in current prior art processes. However, a thicker silicide film requires a deeper junction and has the disadvantage that increased diffusion during formation may cause stresses in the structure and slight changes in the effective dimensions.

In view of the above mentioned drawbacks with prior art methods of fabricating metal silicide contacts, there is a continued need for developing a new and improved method wherein silicide contacts can be fabricated without causing any substantial agglomeration of the same.

SUMMARY OF THE INVENTION

One object of the present invention is to provide a method for fabricating CMOS structures in which at least one metal silicide contact is formed prior to activating the source/drain regions of the structure.

Another object of the present invention is to provide a method of fabricating a CMOS structure that contains metal silicide contacts which exhibit little or no agglomeration upon high temperature annealing.

A further object of the present invention is to provide a method of fabricating metal silicide contacts that have increased high temperature stability, yet have a resistivity value that is within current operational standards.

A still further object of the present invention is to provide a metal silicide contact that exists in its lowest resistance phase. For example, when a cobalt (Co) silicide contact is desired, the present invention forms the Co disilicide phase; and when a titanium (Ti) contact is desired, the present invention forms the C54 phase of $TiSi_2$. Both of the above mentioned phases, i.e., Co disilicide and C54 phase of $TiSi_2$, represent the lowest resistance phase of the metal. That is, the Co disilicide phase is of lower resistance than the Co monosilicide phase, while the C54 phase of $TiSi_2$ is of lower resistance than the C49 phase of $TiSi_2$. It is noted that the higher resistance silicide phase material is highly resistance to etching, i.e., substantially non-ecthable, in the etchant solutions mentioned hereinbelow. That is, the higher resistance silicide phase material is substantially non-etchable compared to the unreacted metal alloy layer.

These and other objects and advantages can be obtained in the present invention by adding at least one alloying element to a metal which is capable of producing a metal silicide upon annealing prior to activation of source/drain regions in the structure. By alloying the metal prior to the high temperature source/drain activation anneal, the metal alloy silicide contact of the present invention does not agglomerate. Specifically, the method of the present invention comprises the steps of:

(a) forming a metal alloy layer over a portion of a silicon-containing substrate, said metal alloy layer comprising Co or Ti and an alloying additive, said silicon-containing layer not containing activated source/drain regions embedded therein;

(b) annealing said metal alloy layer at a temperature which is effective in converting a portion of said metal alloy layer into a metal alloy silicide layer that is highly resistant to etching as compared to the unreacted metal alloy layer;

(c) removing any remaining metal alloy layer not converted in step (b);

(d) optionally, annealing said metal alloy silicide layer produced in step (b) so as to convert the same into its lowest resistant phase; and (e) forming activated source/drain regions in said silicon-containing substrate by at least annealing at a temperature of about 900° C. or above, whereby the metal alloy silicide layer formed in steps (b) or (d) does not agglomerate during said activation annealing, and is in its lowest resistance phase after said activation annealing.

Another aspect of the present invention relates to CMOS structures containing the inventive non-agglomerated metal silicide contacts. Specifically, the CMOS structures of the present invention comprise:

a substrate having an exposed region of a silicon-containing semiconductor material, said silicon-containing semiconductor material having source/drain regions formed therein; and a substantially non-agglomerated metal alloy silicide contact formed on a portion of said silicon-containing semiconductor substrate, wherein said substantially non-agglomerated metal alloy silicide contact withstands high temperature annealing conditions which are employed in fabricating the source/drain regions and is in its lowest resistance phase, said source/drain regions being formed after the metal alloy silicide contact is formed.

DETAILED DESCRIPTION OF THE INVENTION

Figure 1A:
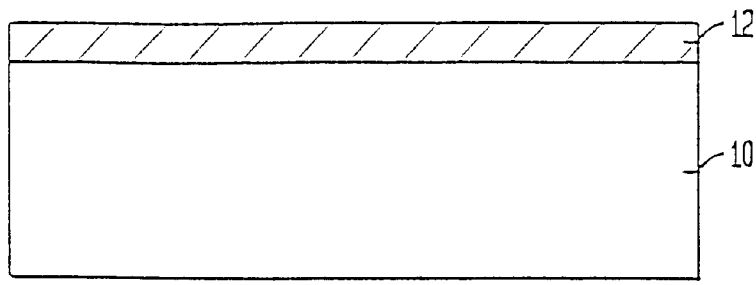
FIGS. 1a–1g are cross-sectional views illustrating the basic processing steps that are employed in the present invention in forming a non-agglomerated metal alloy silicide contact.

The present invention, which is directed to a method and structure for retarding high temperature agglomeration of silicides using metal alloys, will now be described in greater detail by referring to the drawings that accompany the present application. It is noted that in the accompanying drawings like reference numerals are used for describing like and/or corresponding elements.

Reference is first made to FIGS. 1a–1g which illustrate the basic processing steps of the present invention that are capable of forming a CMOS structure in which high temperature agglomeration of the silicide contact is avoided by employing a metal alloy layer—in prior art processes, the silicide contact is made from a pure metal which agglomerates when the source/drain areas of the structure are activated by high temperature annealing. Specifically, the structure shown in FIG. 1a comprises a Si-containing substrate 10 which has a metal alloy layer 12 formed thereon. The Si-containing substrate may optionally include a thin oxide layer that is present near an exposed surface of the substrate; the oxide layer, if present, is at the interface between the metal alloy layer and the Si-containing substrate. Suitable Si-containing substrates that can be employed in the present invention include, but are not limited to: single crystal Si, polycrystalline Si, SiGe, amorphous Si, silicon-on-insulators (SOIs) and other like Si-containing materials.

In embodiments wherein the oxide layer is not present, as is shown in the drawings of the present invention, the oxide layer is removed from the structure prior to employing the processing steps of the present invention. In such an embodiment, HF may be used to completely remove the oxide layer from the structure.

Si-containing substrate 10 may contain various isolation and/or device regions therein. These regions are not shown in the drawings of the present invention but are nevertheless intended to be included therein. In accordance with the present invention, the Si-containing substrate does not, however, contain activated source/drain regions therein prior to formation of the metal alloy silicide contacts; activation of the doped source/drain regions occurs after the metal alloy silicide contact of the present invention is formed.

Metal alloy layer 12 is formed on the surface of substrate 10 (or over the optional oxide layer) using conventional deposition processes that are well known to those skilled in the art. For example, the metal alloy layer may be formed by chemical vapor deposition, plasma-assisted chemical vapor deposition, evaporation, sputtering and other like deposition processes. Of these techniques, it is preferred to form the metal alloy layer by sputtering. Alternatively, the metal alloy layer may be formed by first depositing a metal layer on the surface of the Si-containing substrate, and thereafter doping the metal layer with an appropriate alloying element utilizing ion-implantation or other like doping process.

Metal alloy layer 12 of the present invention comprises at least one metal selected from the group consisting of Co and Ti. That is, layer 12 may comprise a Co alloy or a Ti alloy. Of these alloys, it is preferred that the alloy comprises a Co alloy. The metal alloy layer of the present invention further comprises 0.01 to 50 atomic % of at least one additive, i.e., alloying element, said at least one additive being selected from the group consisting of C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re, Ir, Ce, Pr, Nd, Sm, Eu, Gd, Tb, Dy, Ho, Er, Tm, Yb and Lu. Mixtures of one or more of these additives are also contemplated herein. More preferably, the additive is present in the metal alloy layer in an amount of from about 0.1 to about 20 atomic %. Of the above mentioned additives, C, Al, Si, Sc, Ti, V, Cr, Mn, Fe, Co, Ni, Cu, Ge, Y, Zr, Nb, Mo, Ru, Rh, Pd, In, Sn, La, Hf, Ta, W, Re or Ir are preferred in the present invention. The most preferred alloys are Ti, V, Cr, Ge, Nb, Rh, Ta, W, Hf, Zr, Mo, Re or Ir.

The term "alloy" is used herein to include Co or Ti compositions that have a uniform or non-uniform distribution of said additive therein; Co or Ti compositions having a gradient distribution of said additive therein; or mixtures and compounds thereof. It should be appreciated that when a Co alloy is employed, the additive cannot be Co. Likewise, when a Ti alloy is employed, the additive cannot be Ti.

Figure 1B:
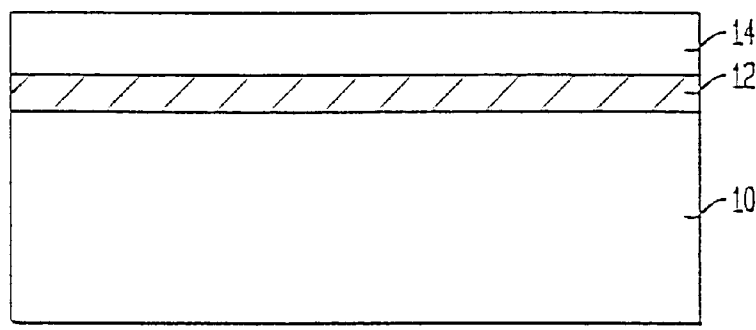

Next, as shown in FIG. 1b, an optional oxygen barrier layer 14 may be formed on the surface of metal alloy layer 12. The optional oxygen barrier layer is formed using conventional deposition processes that are well known to those skilled in the art. Illustrative examples of suitable deposition processes that can be employed in the present invention in forming the optional oxygen barrier layer include, but are not limited to: chemical vapor deposition, plasma-assisted chemical vapor deposition, sputtering, evaporation, plating, spin-on coating and other like deposition processes. The thickness of the optional oxygen barrier layer is not critical to the present invention as long as the oxygen barrier layer is capable of preventing oxygen or another ambient gas from diffusing into the structure. Typically, the optional oxygen barrier layer has a thickness of from about 10 to about 30 nm. In the case of Ti, the optional barrier layer is typically not needed.

The optional oxygen barrier is composed of conventional materials that are well known in the art for preventing oxygen from diffusing into the structure. For example, TiN, $Si_3N_4$, TaN and other like materials can be employed as the oxygen barrier layer. Although the drawings of the present invention show the presence of the optional barrier layer, it is possible to use the method of the present invention in cases wherein the optional barrier layer is not present. As stated above, the optional barrier layer is not typically employed when Ti is employed.

Figure 1C:
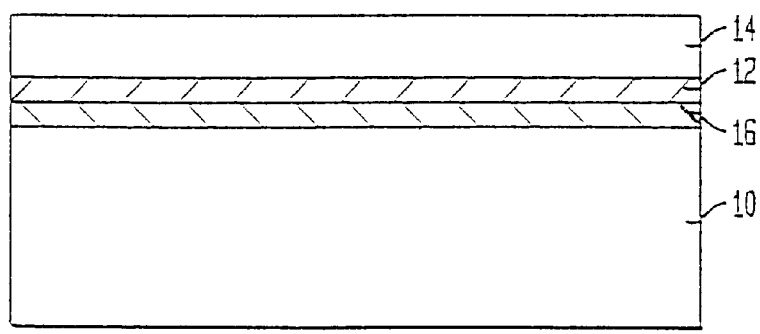

When Co is employed, the structure shown in FIG. 1b may optionally be pre-annealed under conditions that are sufficient in forming a metal rich alloy silicide phase layer 16 in the structure (See FIG. 1c). Pre-annealing is carried out using a rapid thermal anneal (RTA) process. Typically, the optional pre-annealing step is carried out in a gas atmosphere, e.g., He, Ar, $N_2$ or forming gas, at a temperature of from about 350° to about 450° C. for a time period of about 300 seconds or less using a continuous heating regime or a ramp and soak heating regime. Other temperatures and times are also contemplated herein so long as the conditions chosen are capable of forming the metal rich alloy silicide phase layer in the structure.

Figure 1D:
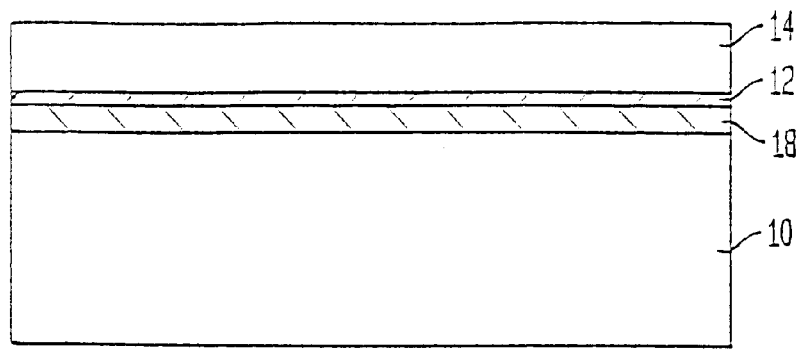
Figure 1E:
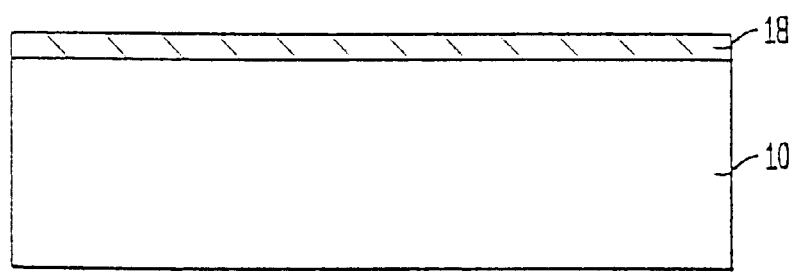

In accordance with the next step of the present application, See FIG. 1d, an annealing step is carried out on the structure shown in FIG. 1b or optionally FIG. 1c so as to form a metal alloy silicide layer 18 in the structure which exists in a high resistance phase, i.e., Co monosilicide or the C49 phase of $TiSi_2$. That is, the first annealing step forms a silicide phase of Co or Ti that is substantially difficult to etch utilizing the etching techniques and etchants described hereinbelow. To form the high resistance phase of the metal alloy silicide layer in the structure, annealing is carried out using a rapid thermal anneal (RTA) process using a gas atmosphere, e.g., He, Ar, Ne or forming gas, at a temperature of from about 400° to about 700° C. for a time period of about 300 seconds or less using a continuous heating regime or a ramp and soak heating regime. Other temperatures and times are also contemplated herein so long as the conditions chosen are capable of forming a high resistance silicide phase of Ti or Co in the structure (i.e., a silicide phase of Ti or Co that is difficult to etch). It is noted that when the optional pre-annealing step is employed, the annealing temperatures used in the formation of the high resistance silicide layer are higher than the pre-annealing temperatures.

After the first annealing step, optional oxygen diffusion barrier 14 and any remaining metal alloy layer 12 are removed from the structure (See, FIG. 1e) using conventional etching techniques that are well known to those skilled in the art. For example, any wet etch process may be used in removing the optional oxygen barrier layer and the metal alloy layer from the structure. The chemical etchant employed in the wet etch process must be highly selective in removing the oxygen barrier layer and the metal alloy layer as compared to the substantially non-etchable (i.e., high resistance) silicide phase of Co or Ti. A suitable etchant that can be employed in the present invention is a mixture of hydrogen peroxide and nitric or sulfuric acid. Other chemical etchants can also be employed in the present invention.

It is also within the contemplation of the present invention to use a dry etch process in removing the optional oxygen barrier layer and any remaining metal alloy layer from the structure. Suitable dry etching techniques that can be used herein include, but are not limited to: reactive-ion etching, ion beam etching, plasma etching and other like dry etching techniques.

An optional annealing step may required to convert the high resistance Co and Ti silicide phase layer into a Co or Ti silicide layer that has a lower resistance. That is, for Co, the first annealing step forms the Co monosilicide phase (high resistance, non-etchable material) and the optional annealing step converts the monosilicide phase into Co disilicide (lower resistance silicide phase as compared to the monosilicide phase). Insofar as Ti is concerned, the first annealing step forms the high resistance C49 phase of $TiSi_2$, and the optional annealing step converts the same into the low resistance C54 phase of $TiSi_2$.

Figure 1F:
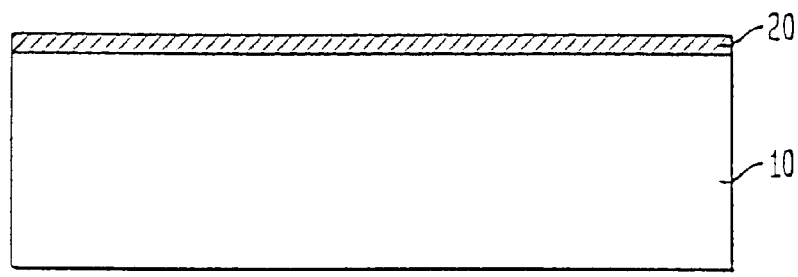
Figure 1G:
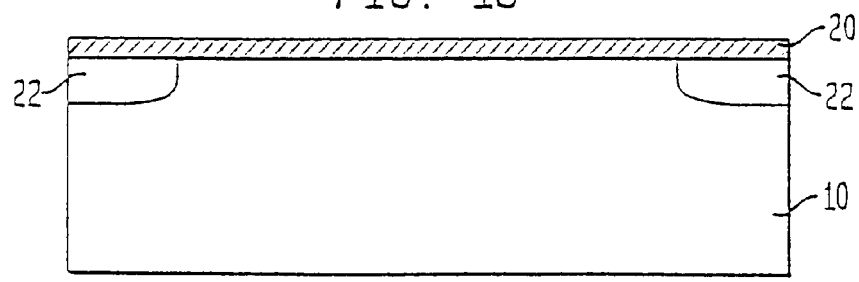

The optional annealing step is carried out at a temperature that is higher than the temperature used in either the pre-anneal or first anneal. The optional annealing step is also carried out by RTA using a gas ambient. Typically, the optional annealing step is carried out at a temperature of from about 700° to about 900° C. for a time period of about 300 seconds or less using a continuous heating regime or a ramp and soak heating regime. Other temperatures and times are also contemplated herein so long as the conditions chosen are higher than the pre-anneal and the first anneal steps so that the lowest resistance silicide phase of Ti or Co is formed in the structure. The resultant structure that is obtained using the optional annealing step of the present invention is shown in FIG. 1f.

After the first annealing step, subsequent etching and optional anneal, source/drain regions 22 are activated in the Si-containing substrate using conventional techniques that are well known to those skilled in the art. For example, source/drain regions 22 are activated using a high temperature (900° C. or above; time duration 1 second or less) activation anneal step. More specifically, the doped source/drain regions formed in the Si-containing substrate are activated by RTA at a temperature of from about 900° to about 1100° C. for a time period of about 60 seconds or less. Other temperatures and times can also be used in activating the source/drain regions. The source/drain regions may be formed in the structure prior to conducting the above processing steps by utilizing conventional ion implantation. Alternatively, the source/drain regions can be formed after forming the metal silicide contacts by utilizing conventional ion implantation and annealing. In either case, the activation anneal takes places after the metal alloy silicide is formed and selective etching is preformed.

It is noted that under the above activation anneal conditions prior art metal silicide contacts made from a pure metal agglomerate. This agglomeration is undesirable since it causes an increase in resistance and leakage. By employing a metal alloy layer, as described above, the resultant metal alloy silicide was found to withstand high temperature activation anneals thereby avoiding the problems with prior art structures containing metal silicide contacts.

After forming the source/drain regions in the CMOS structure, conventional processing steps can be employed to fabricate other device regions such as gate regions on the structure.

The electrical contact of the present invention comprises:
a substrate 10 having an exposed region of a silicon-containing semiconductor material, said silicon-containing semiconductor material being doped with an impurity; and a first layer of a metal alloy silicide contact 20, wherein said alloy is present in said first layer in an amount of from about 0.01 to about 50 atomic %, said metal is selected from the group consisting of Co and Ti and said metal alloy silicide contact is in its lowest resistance phase.

The present examples are given to illustrate the present invention and to demonstrate some of the advantages that can arise therefrom.

EXAMPLES

In the following examples, studies were performed using Co alloys that contain various alloying additives and comparisons were made to pure $CoSi_2$ contacts.

HIGH TEMPERATURE DEGRADATION OF $CoSi_2$ MADE FROM PURE Co METAL

A $CoSi_2$ contact was made in accordance with standard silicide processing steps (starting from a TiN/Co bilayer) in which a first anneal at 550° C. was used to form a monosilicide layer and a selective etch was then employed to remove both the TiN cap and any unreacted Co. A second anneal was thereafter employed at 750° C. for 20 seconds to form the disilicide layer. High temperature degradation was then studied by subjecting the samples to 1000° C. for various periods of time.

Figure 2:
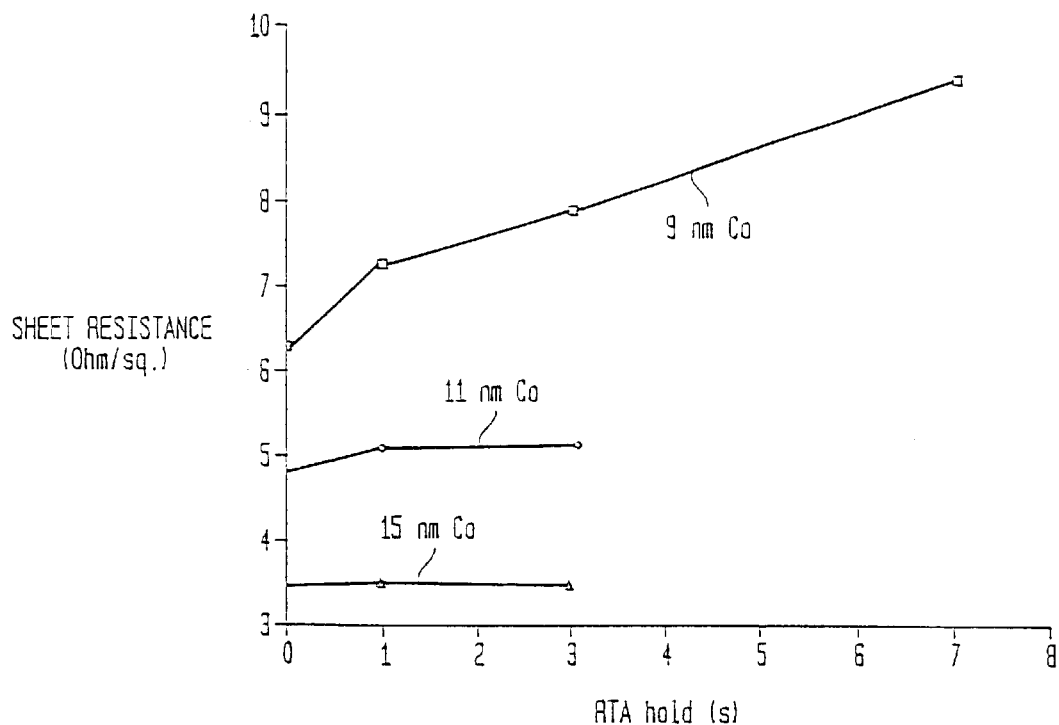
FIG. 2 is a graph of sheet resistance (ohm/sq.) vs. anneal holding time (seconds) at 1000° C. using a ramp rate of about 100° C./second.

The degradation of pure CoSi$_2$ films was first measured, as shown in FIG. 2, as an increase in sheet resistance (SR) as a function of increasing annealing times for starting Co thicknesses of 9, 11 and 15 nm, respectively. These Co thicknesses correspond to 32, 39 and 53 nm CoSi$_2$. For the 9 nm Co film, a 7 second hold at 1000° C. increased the SR by more than 50%. The increase was not as pronounced for thicker films. For annealing times up to 3 seconds, the SR of the thicker Co disilicide did not significantly change, while an increase in SR was clearly observed for the two thinner films.

Figure 3:
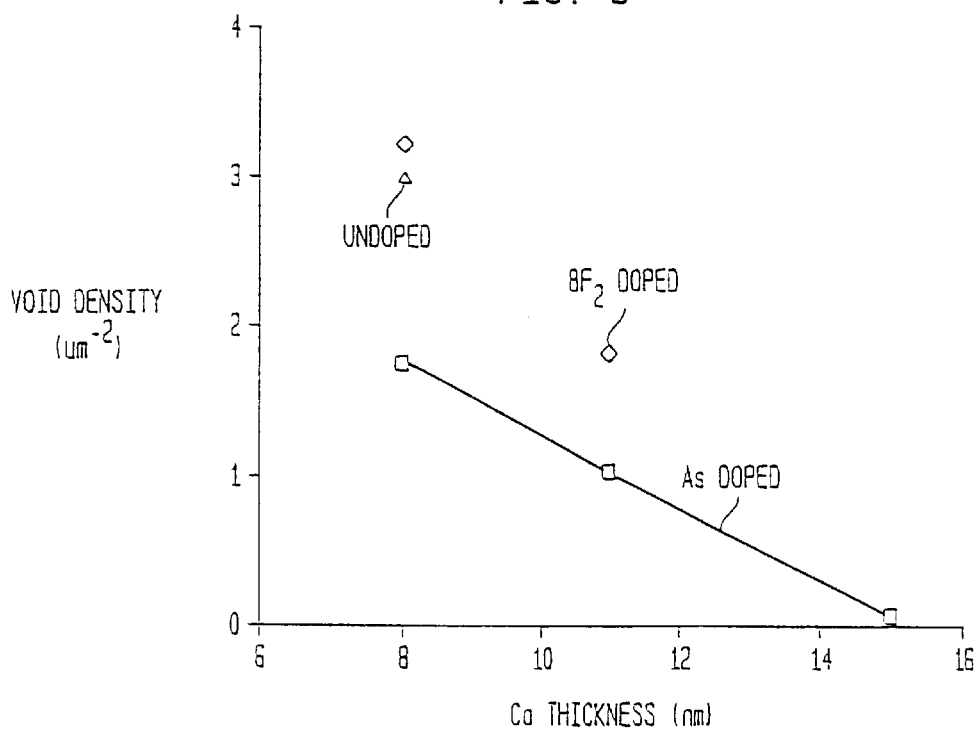
FIG. 3 is a graph of void density ($\mu m^{-2}$) in $CoSi_2$ vs. initial Co thickness (nm) using a ramping rate of about 100° C./second.

The thermal degradation was also measured by the number of voids in the film observed by scanning electron microscopy (SEM). The density of voids as a function of starting Co thickness is illustrated in FIG. 3. These results again showed that the thicker films are more stable. Comparing the silicon dopants, the degradation was worse for boron doped substrates as compared to As doped substrates.

COMPARISON OF PURE CoSi$_2$ WITH FILMS MADE FROM Co ALLOYS

Figure 4:
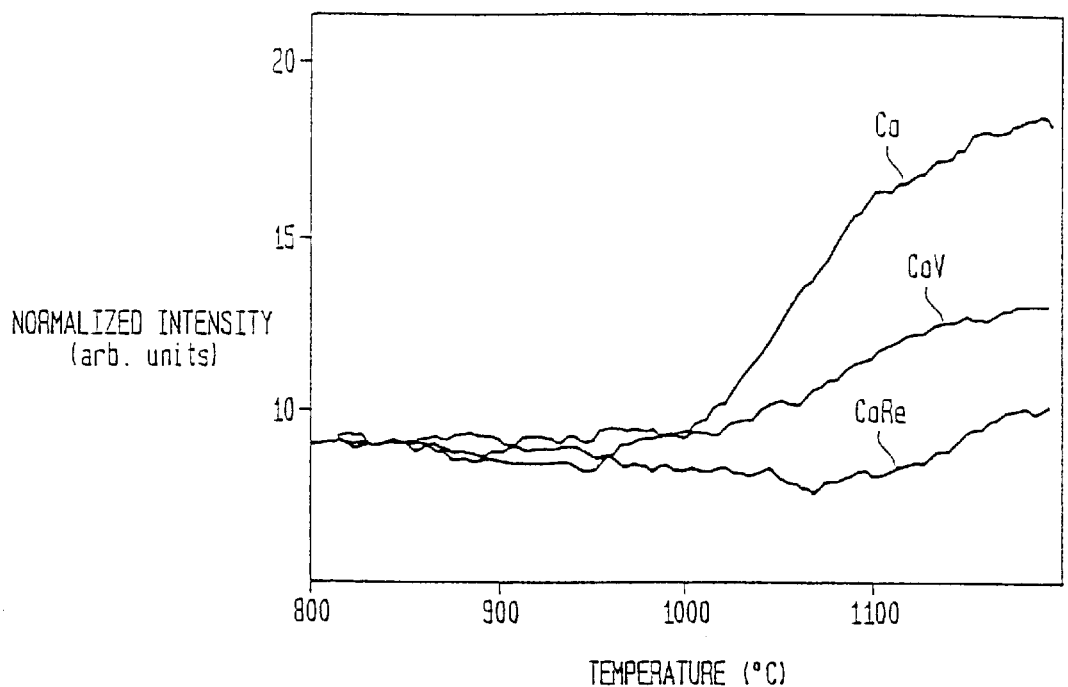
FIG. 4 is a graph of light scattering data, i.e., normalized intensity (arbitrary units) vs. Temperature (° C.), for pure Co (prior art) and Co alloy silicide films (invention).

The following results compare the high temperature characteristics of the pure CoSi$_2$ films and the films formed from Co alloys, as in accordance with the present invention. In FIG. 4, the roughness of the films was measured using elastic light scattering during a ramped thermal anneal of 3° C./sec up to 1150° C. in purified N$_2$. The geometry of detection was such that the detected light was scattered by lateral length scales of about 0.5 μm. The three disilicides samples studied were from 8 nm thick films of pure Co, Co with 5 atomic (at.) % V, and Co with 5 atomic % Re. It was clear from the increase in scattering that the roughness of CoV and CoRe silicides at high temperatures was lower than that of pure CoSi$_2$. Not only was the roughness smaller for the alloyed sampled, but more importantly for this application, the temperature onset for thermal degradation was also higher. This is an important finding since it allows for an increased processing window as compared to the prior art sample.

Figure 5:
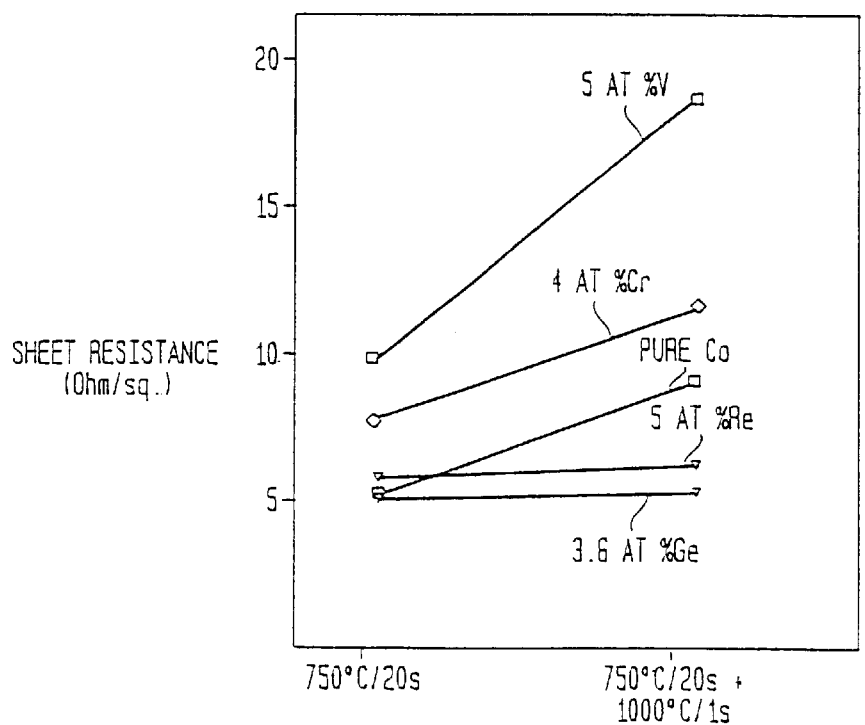
FIG. 5 is a graph showing the variation in sheet resistance (ohms/sq.) of a Co alloy disilicide caused by a 1 second, 1000° C. anneal.

The light scattering measurement during annealing only gave information on the film morphology. Although the roughness was lower, it was important to verify that the resistivity was still within the acceptable range for working CMOS devices. At higher temperatures, the alloying element could precipitate or diffuse to interfaces or grain boundaries and contribute to a significant increase in resistivity even if the surface is smoother. FIG. 5 shows the variation in sheet resistance caused by a 1000° C. anneal for 1 second for Co alloys of Ge, V and Re compared to pure Co. Compared to pure CoSi$_2$, the increase in sheet resistance is similar or larger for the films containing Cr or V (the highest increase in SR). Note that from FIG. 4, it was determined that the V sample was smoother than the pure Co film. This result illustrates the contribution of V in the resistivity increase. Two of the alloy silicides, (Co$_{0.95}$Re$_{0.05}$Si$_2$ and Co$_{0.964}$Ge$_{0.036}$Si$_2$) presented here showed a stable sheet resistance after high temperature anneal. These two alloy films are thus good candidates to delay and/or prevent the agglomeration of suicides to higher temperatures without significant increases in resistivity.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a substantially non-agglomerated metal alloy silicide contact comprising the steps of:

(a) forming a metal alloy layer over a portion of a silicon-containing substrate, wherein said metal alloy layer comprises Co or Ti and an alloying additive, said silicon-containing layer not containing activated source/drain regions embedded therein and said alloying additive is C, Al, Si, Sc, Ti, V, Cr, Mn, Fe, Co, Ni, Cu, Y, Zr, Nb, Mo, Ru, Rh, Pd, Sn, La, Hf, W, Re, Ir, Ce, Pr, Nd, Sm, Eu, Gd, Th, Dy, Ho, Er, Tm, Yb, Lu or mixtures thereof;

(b) annealing said metal alloy layer at a temperature which is effective in converting a portion of said metal alloy layer into a metal alloy silicide layer, said metal alloy silicide layer being difficult to etch compared to said metal alloy layer and being substantially resistant to agglomerization during a subsequent high temperature annealing step; and (c) removing any remaining metal alloy layer not converted in step (b).

2. The method of claim 1 further comprising pre-annealing the metal alloy layer prior to step (b) at a temperature sufficient to form a metal rich alloy silicide layer.

3. The method of claim 1 further comprising forming a barrier layer over said metal alloy layer prior to step (b), wherein said barrier layer is removed by step (c).

4. The method of claim 1 wherein said alloying additive is C, Al, Sc, Ti, V, Cr, Mn, Fe, Co, Ni, Cu, Y, Zr, Nd, Mo, Ru, Rh, Pd, Sn, La, Hf, W, Re, Ir or mixtures thereof.

5. The method of claim 4 wherein said alloying additive is Ti, V, Cr, Nb, Rh, W, Hf, Zr, Mo, Re, Ir or mixtures thereof.

6. The method of claim 1 wherein said alloying additive is present is said metal alloy layer in an amount of from about 0.01 to about 50 atomic %.

7. The method of claim 6 wherein said alloying additive is present is said metal alloy layer in an amount of from about 0.1 to about 20 atomic %.

8. The method of claim 1 wherein said metal alloy layer comprises a Co alloy and step (b) forms a Co alloy monosilicide phase.

9. The method of claim 3 wherein said barrier layer is composed of TiN.

10. The method of claim 1 wherein said silicon-containing substrate comprises a single crystal Si, polycrystalline Si, SiGe, amorphous Si, or a silicon-on-insulator (SOI).

11. The method of claim 2 wherein said pre-annealing step is carried out using rapid thermal annealing (RTA).

12. The method of claim 11 wherein said RTA is carried out at a temperature of from about 350° to about 450° C. for a time period of about 300 seconds or less.

13. The method of claim 1 wherein said annealing step (b) is carried out by RTA.

14. The method of claim 13 wherein said RTA is carried out at a temperature of from about 400° to about 700° C. for a time period of about 300 seconds or less.

15. The method of claim 1 wherein said optional annealing step is carried out by RTA.

16. The method of claim 15 wherein said RTA is carried out at a temperature of from about 700° to about 900° C. for a time period of about 300 seconds or less.

17. The method of claim 1 wherein said remaining metal alloy layer is removed utilizing a wet etch step that includes the use of an etchant that is selective for removing said layers.

18. The method of claim 1 wherein said low resistance phase of said metal alloy silicide layer is Co disilicide or C54 phase of $TiSi_2$.

19. The method of claim 1 wherein said metal alloy layer is formed by a deposition process selected from the group consisting of chemical vapor deposition (CVD), plasma-assisted CVD, evaporation and sputtering.

20. The method of claim 1 wherein said metal alloy layer is formed by first depositing said metal and thereafter doping the deposited metal with said alloying additive.

21. The method of claim 1 further comprising performing a second anneal that is carried out at a temperature that is effective in converting the metal alloy silicide layer formed in step (b) to its lowest resistance phase, said second anneal being carried out after step (c).

22. The method of claim 1 wherein said subsequent high temperature annealing step is employed to activate source/drain regions in said silicon-containing substrate.

23. The method of claim 22 wherein said subsequent high temperature annealing step is carried out at a temperature of about 900° C. or above, whereby the metal alloy silicide layer does not agglomerate during said activation annealing and it is in its lowest resistance phase after said annealing.

\* \* \* \* \*

UNITED STATES PATENT AND TRADEMARK OFFICE
CERTIFICATE OF CORRECTION

PATENT NO. : 6,413,859 B1
DATED : July 2, 2002
INVENTOR(S) : Cyril Cabral, Jr. et al.

It is certified that error appears in the above-identified patent and that said Letters Patent is hereby corrected as shown below:

Column 8,
Line 37, second instance of "is" should read -- in --
Line 40, second instance of "is" should read -- in --

Signed and Sealed this

Nineteenth Day of November, 2002

Attest:

Attesting Officer

JAMES E. ROGAN
*Director of the United States Patent and Trademark Office*